(12) United States Patent
Miura et al.

(10) Patent No.: US 12,527,130 B2
(45) Date of Patent: Jan. 13, 2026

(54) LIGHT EMITTING DEVICE AND METHOD OF MANUFACTURING LIGHT EMITTING DEVICE

(71) Applicant: NICHIA CORPORATION, Anan (JP)

(72) Inventors: Soichiro Miura, Tokushima (JP); Shota Takase, Tokushima (JP)

(73) Assignee: NICHIA CORPORATION, Anan (JP)

( * ) Notice: Subject to any disclaimer, the term of this patent is extended or adjusted under 35 U.S.C. 154(b) by 492 days.

(21) Appl. No.: 17/947,294

(22) Filed: Sep. 19, 2022

(65) Prior Publication Data
US 2023/0090933 A1    Mar. 23, 2023

(30) Foreign Application Priority Data
Sep. 22, 2021   (JP) .................................. 2021-154421

(51) Int. Cl.
*H10H 20/85*       (2025.01)
*H10H 20/01*       (2025.01)

(52) U.S. Cl.
CPC ....... *H10H 20/8506* (2025.01); *H10H 20/036* (2025.01)

(58) Field of Classification Search
CPC ......... H01L 33/483–486; H10K 50/841–8428; H10K 50/85–865
See application file for complete search history.

(56) References Cited

U.S. PATENT DOCUMENTS

| | | | |
|---|---|---|---|
| 2008/0179524 A1 | 7/2008 | Ichikawa | |
| 2008/0296719 A1 | 12/2008 | Ichikawa | |
| 2022/0328729 A1* | 10/2022 | Lunev | ..................... H01L 33/58 |

FOREIGN PATENT DOCUMENTS

| | | | |
|---|---|---|---|
| JP | S52-022493 A | | 2/1977 |
| JP | H09-007416 A | | 1/1997 |
| JP | H09-082825 A | | 3/1997 |
| JP | 2001-060635 A | | 3/2001 |
| JP | 2008-180629 A | | 8/2008 |
| JP | 2008-298708 A | | 12/2008 |
| JP | 2010-246001 A | | 10/2010 |
| JP | 2014067895 A | * | 4/2014 |

(Continued)

*Primary Examiner* — Monica D Harrison
*Assistant Examiner* — Moataz Khalifa
(74) *Attorney, Agent, or Firm* — Foley & Lardner LLP

(57) ABSTRACT

A light emitting device includes a semiconductor light emitting element and a package that seals the semiconductor light emitting element. The package includes a base having a first upper surface region directly or indirectly supporting the semiconductor light emitting element, and a second upper surface region surrounding the first upper surface region in a plan view viewed in a direction normal to the first upper surface region. The package further includes a cover bonded to the base, an inner metal layer disposed on the second upper surface region of the base, an outer metal layer extending along the outer edge of the inner metal layer, and a slit part on the second upper surface region between the inner metal layer and the outer metal layer. In the plan view, the inner edge of the inner metal layer is positioned inward of the outer edge of the cover. In the plan view, at least a portion of the outer edge of the outer metal layer is positioned outward of the outer edge of the cover. The cover is bonded to the base via a bonding material disposed on the inner metal layer.

22 Claims, 15 Drawing Sheets

(56) References Cited

FOREIGN PATENT DOCUMENTS

| JP | 2014-082452 A | | 5/2014 |
|---|---|---|---|
| JP | 2015185794 A | * | 10/2015 |
| JP | 2017-054856 A | | 3/2017 |
| WO | WO-2021/085071 A1 | | 5/2021 |

* cited by examiner

LIGHT EMITTING DEVICE AND METHOD OF MANUFACTURING LIGHT EMITTING DEVICE

CROSS REFERENCE TO RELATED APPLICATION

This application claims priority to Japanese Patent Applications No. 2021-154421, filed on Sep. 22, 2021, the entire contents of which are hereby incorporated by reference.

BACKGROUND

The present disclosure relates to a light emitting device and a method of manufacturing the light emitting device.

Japanese Patent Publication No. 2017-54856 discloses a package that seals electronic parts and wiring circuits. Japanese Patent Publication No. 2014-67895 discloses a package that hermitically seals an infrared detection element. The packages disclosed by these patent publications each include a base that supports the electronic parts, and a cover. The electronic parts are sealed in a package by solder bonding a metal layer disposed on the base and a metal layer disposed on the cover.

SUMMARY

In the case of employing the package disclosed in either of the patent publications described above, a portion of the bonding material used to bond the base and the cover may flow out of the package, causing manufacturing defects such as solder ball defects.

The present disclosure provides a light emitting device equipped with a package in which such problems can be solved, and a method of manufacturing the light emitting device.

A light emitting device according to an exemplary embodiment of the present disclosure includes a semiconductor light emitting element and a package that seals the semiconductor light emitting element. The package includes a base having a first upper surface region directly or indirectly supporting the semiconductor light emitting element, and a second upper surface region surrounding the first upper surface region in a plan view viewed in a direction normal to the first upper surface region. The package further includes a cover bonded to the base, an inner metal layer disposed on the second upper surface region of the base, an outer metal layer extending along the outer edge of the inner metal layer, and a slit part on the second upper surface region between the inner metal layer and the outer metal layer. In the plan view, the inner edge of the inner metal layer is positioned inward of the outer edge of the cover. In the plan view, at least a portion of the outer edge of the outer metal layer is positioned outward of the outer edge of the cover. The cover is bonded to the base via a bonding material disposed on the inner metal layer.

A method of manufacturing a light emitting device according to an exemplary embodiment of the present disclosure includes: preparing a base and a cover, the base including a first upper surface region, a second upper surface region surrounding the first upper surface region in a plan view, an inner metal layer positioned on the second upper surface region, an outer metal layer extending along the outer edge of the inner metal layer, and a slit part on the second upper surface region between the inner metal layer and the outer metal layer; disposing a semiconductor light emitting element on the first upper surface region of the base; applying a bonding material on the inner metal layer; and bonding the cover and the base via the bonding material.

According to certain embodiments of the present disclosure, a light emitting device including a package in which the bonding material can be hindered from flowing out, which allows for reducing manufacturing defects such as solder ball defects, and a method of manufacturing the light emitting device can be provided.

DETAILED DESCRIPTION

Figure 1:
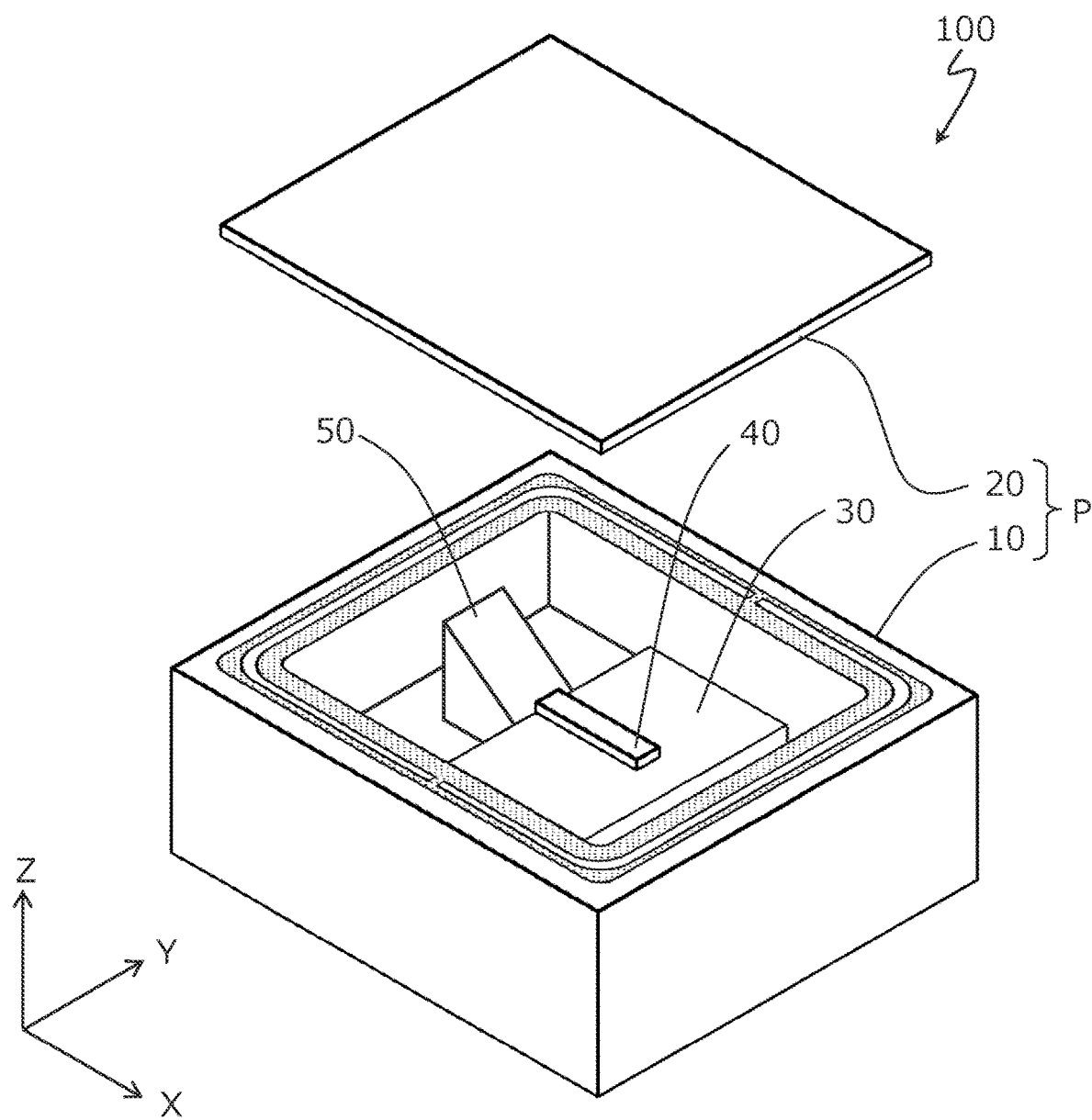
FIG. 1 is an exploded view of a light emitting device according to a first embodiment of the present disclosure.

Certain embodiments of the present disclosure will be explained in detail below with reference to the accompanying drawings. The embodiments described below are exemplary, and the light emitting devices according to the present disclosure are not limited to the embodiments described below. For example, the numerical values, shapes, materials, manufacturing steps, and the sequence of the steps are presented merely as examples, and can be modified in various ways to the extent that such modifications do not cause any technical inconsistency. The embodiments described below are merely provided as examples, and can be combined in various ways to the extent that such combinations do not cause any technical inconsistency.

The dimensions, shapes, and the like of the constituent elements shown in the drawings may be exaggerated for clarity, and may not reflect the dimensions and the shapes of, and the magnitude relations between, the constituent elements in an actual light emitting device. Furthermore, certain elements might be omitted in a drawing such that the drawing would not be excessively complex.

In the explanation below, constituent elements having practically the same function will be denoted with common reference numerals for which redundant explanations will be omitted. Furthermore, terms indicating directions or positions (for example, "upper," "lower," "right," "left" or other terms related thereto) may occasionally be used. These terms, however, are merely used to clarify the relative directions or positions in a referenced drawing. As long as the relationship between the directions or the positions indicated with the terms such as "above," "under," or the like is the same as that in a referenced drawing, the layout of the elements in another drawing, an actual product, and manufacturing equipment outside of the present disclosure, does not have to be the same as that shown in the referenced drawing.

In the description or the accompanying claims, a polygon, such as a triangle, rectangle, or the like, is not limited to that in a mathematically strict sense, and includes a shape with modification, such as having slanted corners, rounded corners, inverse-rounded corners, or the like. Moreover, such modifications are not necessarily limit to a corner (an end of a side). A shape with modification at an intermediate portion of a side will similarly be referred to as a polygon. In other words, any polygon-based shape with partial modification should be understood to be included in the interpretation of a "polygon" in the description and the accompanying claims.

There may be a case in which, when an excessive amount of a bonding material is applied, a portion of the bonding material flows out of a package to cause manufacturing defects such as solder ball defects. On the other hand, when a small amount of a bonding material is applied, solder ball formation can be reduced, but bonding deficiencies may occur, which may result in difficulty in achieving an airtight sealing for the package. In a light emitting device according to an embodiment of the present disclosure, an inner metal layer and an outer metal layer is disposed on the base and a slit part is formed between the inner metal layer and the outer metal layer, which allows for solving the problems described above.

With reference to the drawings, the structures of light emitting devices according to certain embodiments of the present disclosure will be explained. For reference purposes, an X-axis, a Y-axis, and a Z-axis that are orthogonal with one another are shown in the drawings.

First Embodiment

Figure 2:
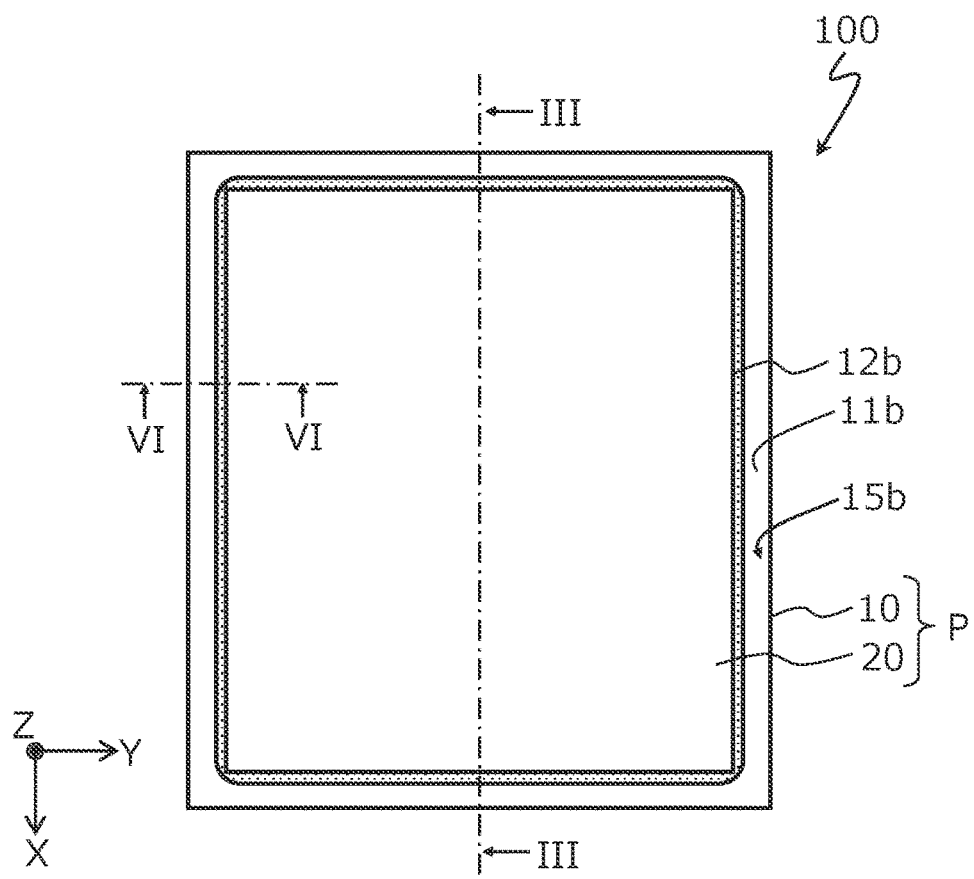
FIG. 2 is a plan view of the light emitting device according to the first embodiment of the present disclosure.
Figure 3:
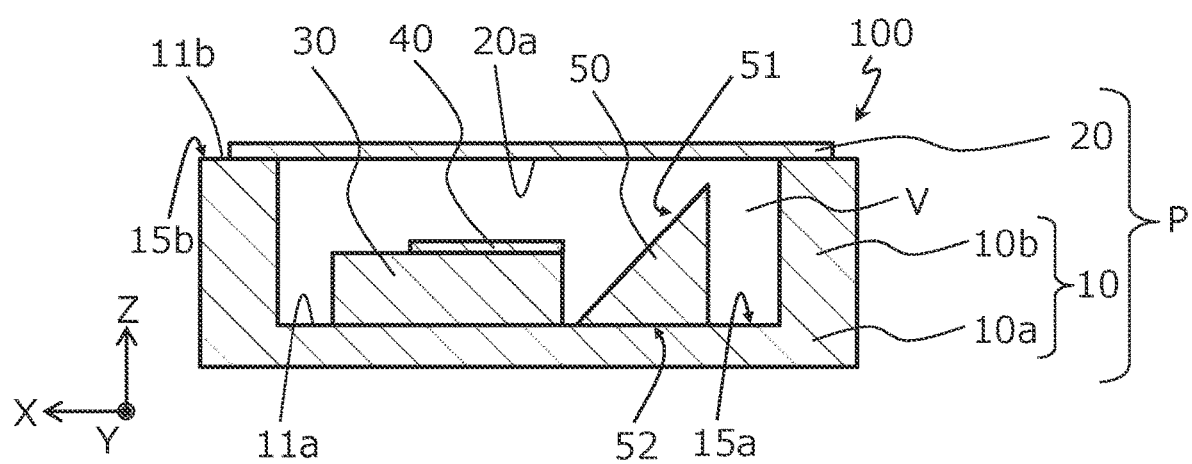
FIG. 3 is a cross-sectional view of the light emitting device taken along line III-III in FIG. 2.
Figure 4:
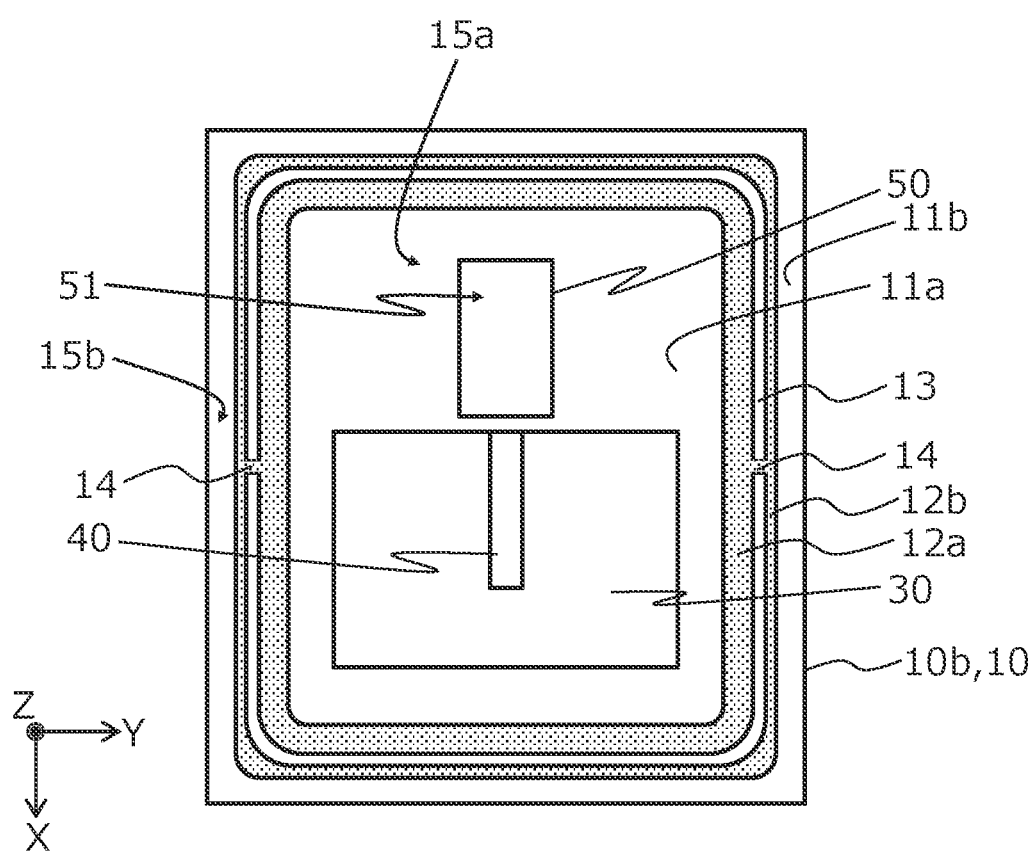
FIG. 4 is a plan view of the light emitting device according to the first embodiment of the present disclosure shown without a cover.
Figure 5:
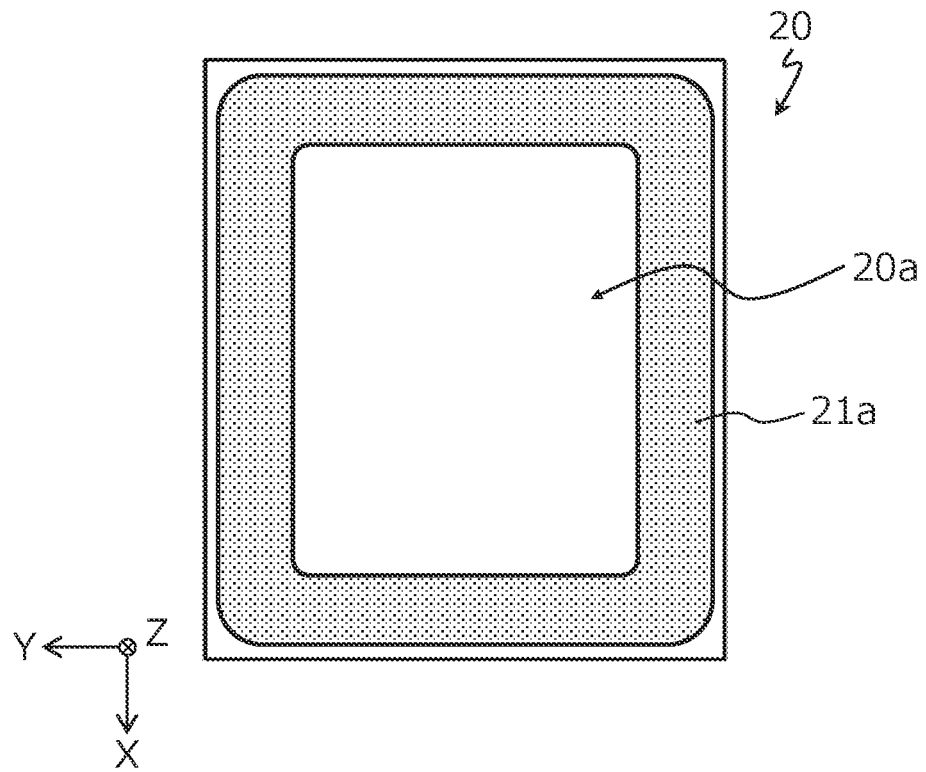
FIG. 5 is a bottom view of the cover.
Figure 6:
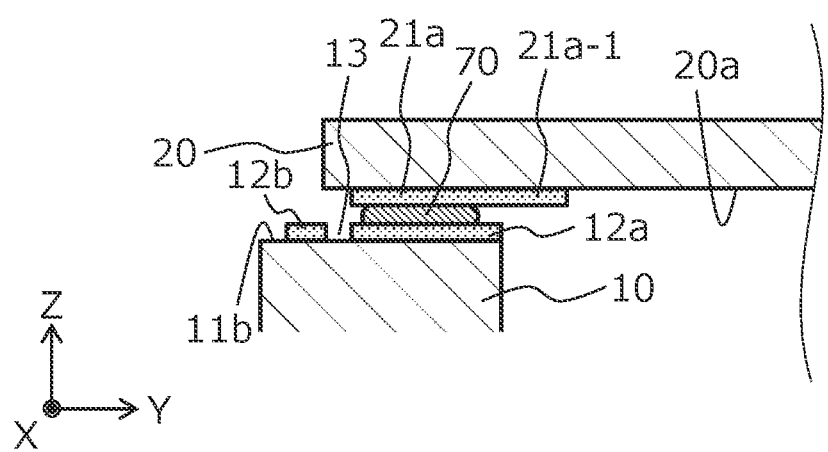
FIG. 6 is an enlarged view of a portion of the joint between the base and the cover.

Descriptions with reference to FIG. 1 to FIG. 6 will be given. FIG. 1 is an exploded view of a light emitting device 100 according to a first embodiment. FIG. 2 is a plan view of the light emitting device 100 when viewed in the direction normal to the planar support surface 15a of the base 10. FIG. 3 is a cross-sectional view of the light emitting device 100 taken along line in FIG. 2. FIG. 4 is a plan view of the light emitting device 100, shown without a cover 20, in a plan view when viewed in the direction normal to the planar support surface 15a of the base 10. FIG. 5 is a bottom view of the cover 20 when viewed from the lower surface region 20a side. FIG. 6 is an enlarged view of a portion of the joint between the base 10 and the cover 20. The enlarged portion shown in FIG. 6 is a portion in the cross section of the light emitting device 100 taken along line VI-VI in FIG. 2.

The light emitting device 100 according to the first embodiment of the present disclosure has a semiconductor light emitting element 40, and a package P that seals the semiconductor light emitting element 40. The light emitting device 100 illustrated in FIG. 1 further includes a submount 30 that supports the semiconductor light emitting element 40, and an optical member 50 having a reflective surface at which light emitted from the semiconductor light emitting element 40 is reflected upward. As described below, the light emitting device 100 can include a plurality of semiconductor light emitting elements 40. Depending on the product specifications or required specifications, the light emitting device 100 can include a protective device represented by a Zener diode and/or a temperature sensor such as a thermistor for measuring the internal temperature. Furthermore, the light emitting device 100 may include a light receiving element, such as a photodiode, for monitoring the intensity of light emitted from the semiconductor light emitting element 40.

The light emitting device 100 illustrated in FIG. 1 generally has a rectangular cuboid shape. The shape of the light emitting device 100, however, is not limited to this. The size of the light emitting device 100, for example, is about 1.0 mm to about 15.0 mm in the X direction, and about 1.0 mm to about 15.0 mm in the Y direction. The thickness of the light emitting device 100 in the Z direction can be about 1.0 mm to about 6.0 mm.

Package P, Base 10, and Cover 20

The package P has a base 10, and a cover 20 bonded to the base 10. The base 10 has a bottom part 10a having a planar support surface 15a, and a lateral wall part 10b supported on a plane including the planar support surface 15a. While the base 10 illustrated in FIG. 3 is a member in which the bottom part 10a and the lateral wall part 10b are integrally formed, the base 10 may have other structure. The base 10 may have a structure in which a bottom part 10a and a lateral wall part 10b are separate parts and the lateral wall part 10b is bonded to the peripheral region of the planar support surface 15a of the bottom part 10a. The submount 30, which supports the semiconductor light emitting element 40, and the optical member 50 are disposed on the planar support surface 15a and surrounded by the lateral wall part 10b.

As illustrated in FIG. 3 and FIG. 4, the base 10 has a first upper surface region 11a which directly or indirectly supports the semiconductor light emitting element 40, and a second upper surface region 11b which in a plan view surrounds the first upper surface region 11a. The term "plan view" as used in the present disclosure is a plan view when viewed in the direction normal to the planar support surface 15a or the first upper surface region 11a. In the drawings, the direction normal to the planar support surface 15a or the first upper surface region 11a coincides with the Z direction. In the base 10, there is a height difference between the planar support surface 15a and the upper surface 15b of the lateral wall part 10b. The first upper surface region 11a is located in the planar support surface 15a, and the second upper surface region 11b is located in the upper surface 15b of the lateral wall part 10b which is positioned higher than the planar support surface 15a. In other words, in the package P of the light emitting device 100, there is a height difference between the first upper surface region 11a and the second upper surface region 11b. This allows the semiconductor light emitting element 40 to be positioned away from the second upper surface region 11b to which the cover 20 is bonded, which allows for preventing the heat applied to bond the cover 20 or the like from affecting the semiconductor light emitting element 40.

The height difference between the first upper surface region 11a and the second upper surface region 11b forms a recessed part in the base 10. Covering the recessed part of the base 10 with the cover 20 forms a sealed space V in the package P. The submount 30 is disposed in the sealed space V to support the semiconductor light emitting element 40. However, the submount 30 is not necessarily employed. In the case of not including a submount 30, the semiconductor light emitting element 40 is directly bonded to the first upper surface region 11a, whereas in the case of including a submount 30, the semiconductor light emitting element 40 is indirectly bonded to the first upper surface region 11a in the state of being supported by the submount 30.

The cover 20 illustrated in FIG. 1 is a sheet-shaped member. As described later, bonding the cover 20 to the base 10 can seal or hermetically seal the sealed space V. Hermetic sealing can substantially prevent degradation of the members arranged in the hermetically sealed space V. Furthermore, as described later, in the case of employing a blue or green light emitting laser diode for the semiconductor light emitting element 40, for example, the dust collecting effect of the laser beam can be reduced.

The base 10 can be formed of, for example, a ceramic, metal, glass, silicon, resin, or the like as a main material. Examples of ceramics include aluminum nitride, silicon nitride, aluminum oxide, silicon carbide, and the like.

The base 10 illustrated in FIG. 4 has an inner metal layer 12a, an outer metal layer 12b, and a slit part 13. The inner metal layer 12a and the outer metal layer 12b are positioned on the second upper surface region 11b of the base 10. In other words, the inner metal layer 12a and the outer metal layer 12b are disposed on the upper surface 15b of the lateral wall part 10b. In the example illustrated, the inner metal layer 12a is continuously formed along the inner edge of the upper surface 15b of the lateral wall part 10b. The outer metal layer 12b is formed to extend along the outer edge of the inner metal layer 12a. The outer metal layer 12b does not need to be continuously formed to completely surround the inner metal layer 12a, i.e., there may be breaks. The width of the outer metal layer 12b may be uneven along the perimeter of the inner metal layer 12a; for example, the width at the corner portions corresponding to the four corners of the base 10 may be larger than the width of the remaining portions. The wider width portions, as described later, can absorb excess bonding material during bonding, thereby reducing the outflow of the bonding material. The slit part 13 is located between the inner metal layer 12a and the outer metal layer 12b on the second upper surface region 11b.

As illustrated in FIG. 2, the plan view, both the inner edge and the outer edge of the inner metal layer 12a shown in FIG. 4 are positioned inward of the outer edge of the cover 20. With this structure, as described later, the bonding material can wet and spread on the inner metal layer 12a even with a small amount of bonding material. Furthermore, because the inner metal layer 12a which contributes to bonding is positioned inward of the outer edge of the cover 20, an adequate bonding area can be secured between the cover 20 and the inner metal layer 12a. This can reduce sealing deficiencies. Moreover, at least a portion of the outer edge of the outer metal layer 12b can be positioned outward of the outer edge of the cover 20. With this structure, the outer metal layer 12b can absorb an excess bonding material not used in bonding the cover 20 and the package P, thereby reducing the outflow of the bonding material. In the plan view, for example, the outer edge of the outer metal layer 12b may be positioned outward of the outer edge of the cover 20 in its entirety as shown in FIG. 2, or a portion of the outer edge of the outer metal layer 12b may be positioned inward of and overlap the outer edge of the cover 20. Alternatively, an entirety of the inner edge of the outer metal layer 12b may be positioned outward of the outer edge of the cover 20 such that the cover 20 does not overlap the outer metal layer 12b.

In the X or Y direction, the width of the outer metal layer 12b is, for example, in a range of 30 µm to 1000 µm. The width of the inner metal layer 12a is larger than the width of the outer metal layer 12b, for example, about 2 to 4 times the width of the outer metal layer 12b. The thickness of the inner metal layer 12a and the outer metal layer 12b is, for example, in a range of 1 µm to 100 µm each. The width of the slit part 13 can be set, for example, to 30 µm or larger. The width of the slit part 13 is, for example, in a range of 30 µm to 500 µm, preferably 30 µm to 300 µm, more preferably 30 µm to 150 µm. When the slit part 13 has a width of 30 µm or greater, as will be described below, even if a small amount of bonding material is applied, the slit part 13 allows for reducing an area at which the bonding material wet-spreads, which can prevent insufficient hermetic sealing. Furthermore, even if an excessive bonding material is applied, the slit part 13 allows for reducing the amount of bonding material wet-spreading onto the outer metal layer 12b, which can facilitate the absorption of the excess bonding material by the outer metal layer 12b, so that the bonding material can be prevented from flowing out of the package.

The base 12 can include one or more branched parts 14. The inner metal layer 12a and the outer metal layer 12b can be connected by the one or more branched parts 14. Each branched part 14 is provided across the slit part 13. In the example shown in FIG. 4, the inner metal layer 12a and the outer metal layer 12b are connected by two branched parts 14. The number of the branched parts 14 is not limited to two, and can be one, three or more. The branched parts 14 are not necessarily located at positions shown in the drawing, but may be located any appropriate positions. The branched parts 14 can be utilized as alignment marks for arranging members on the base 10 during manufacturing. The width of a branched part 14 (the size in the X direction in FIG. 4) can be, for example, 30 µm to 200 µm. In particular, in the case of forming a metal layer pattern by electroplating to be described below, a branched part 14 is useful in allowing an electric current to flow from the inner metal layer 12a via the branched part 14 to a portion of the second upper surface region 11b where the outer metal layer 12b is to be formed.

As shown in FIG. 5 and FIG. 6, the cover 20 has a lower surface region 20a that opposes the first upper surface region 11a and the second upper surface region 11b of the base 10. The cover 20 can have a first cover-side metal layer 21a in the portion of the lower surface region 20a that opposes the inner metal layer 12a. The first cover-side metal layer 21a in the example shown in the drawings includes an inner portion 21a-1 positioned inward of the inner edge of the inner metal layer 12a in a plan view. In the X or Y direction, the width of the first cover-side metal layer 21a is larger than the width of the inner metal layer 12a. The interval between the base 10 and the cover 20 at the joint between the first cover-side metal layer 21a and the inner metal layer 12a is, for example, 5 μm to 300 μm.

The cover 20 in this embodiment has a light transmitting region that transmits light emitted from the semiconductor light emitting element 40. The cover 20 can be formed from, for example, sapphire. Sapphire has light transmissivity, and is a relatively high strength material. The cover 20 can be formed from a light-transmissive material, such as glass, plastic, or quartz, besides sapphire. It is sufficient that the light transmitting portion of the cover 20 is formed from a light-transmissive material, i.e., the remaining portion of the cover does not have to be formed from a light-transmissive material.

The inner metal layer 12a, the outer metal layer 12b, and the first cover-side metal layer 21a can each be formed from a metal material, such as tungsten, molybdenum, nickel, gold, silver, platinum, titanium, copper, aluminum, ruthenium, or the like. Each metal layer preferably is highly wettable by the bonding material.

The cover 20 is bonded to the base 10 via a bonding material disposed on the inner metal layer 12a. More specifically, the package P hermetically seals the semiconductor light emitting element 40 as the first cover-side metal layer 21a and the inner metal layer 12a are bonded by a bonding layer 70 made of the bonding material. Examples of the bonding materials can include metal materials, such as gold-tin, other solder alloys, or brazing materials. In the description below, the outer metal layer 12b and the slit part 13 on the second upper surface region 11b of the base 10 may be referred to as a "flow control structure." For ease of explanation, the bonding material may be denoted by the same reference numeral as that for the bonding layer 70.

Figure 7A:
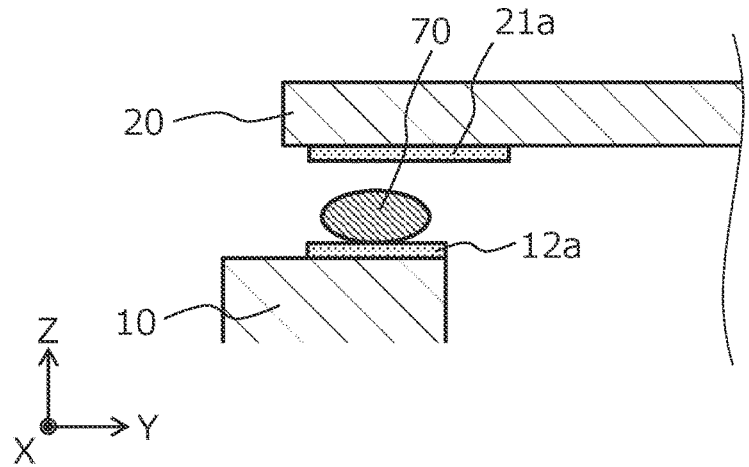
FIG. 7A is a schematic diagram explaining solder ball formation when there is no flow control structure.
Figure 7B:
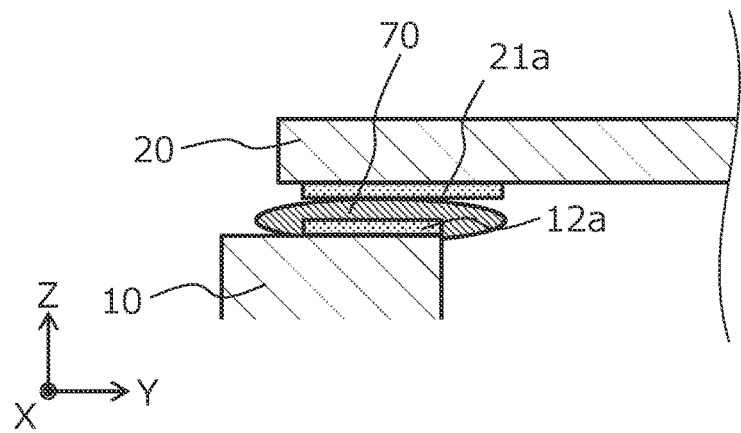
FIG. 7B is a schematic diagram explaining solder ball formation when there is no flow control structure.
Figure 7C:
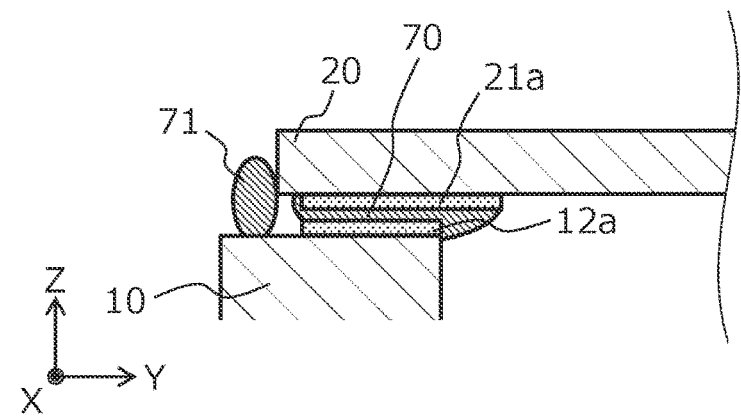
FIG. 7C is a schematic diagram explaining solder ball formation when there is no flow control structure.
Figure 7D:
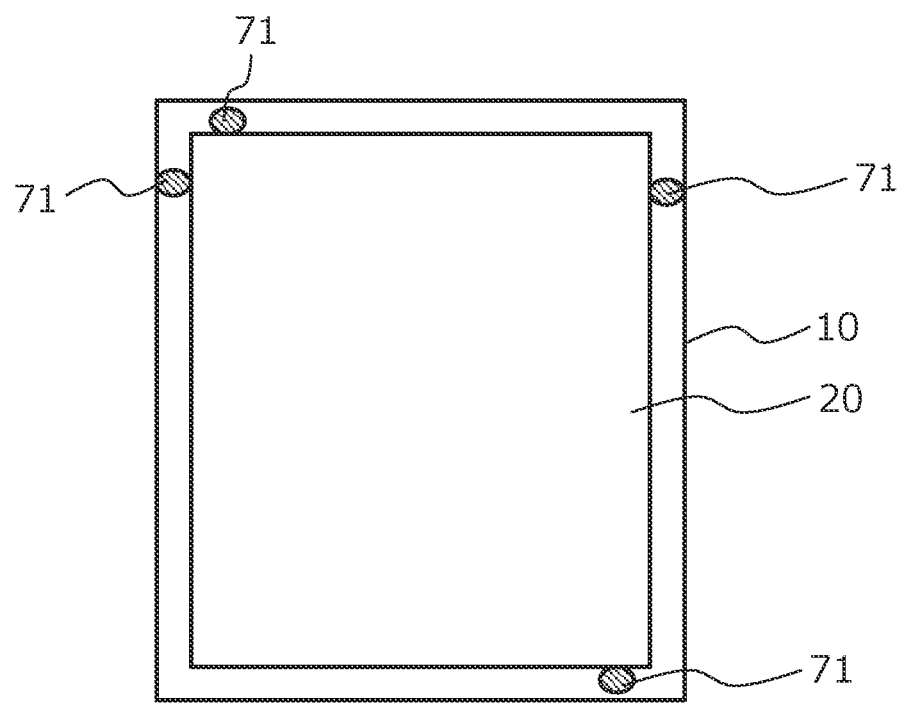
FIG. 7D is a schematic diagram explaining solder ball formation when there is no flow control structure.

FIG. 7A to FIG. 7D are schematic diagrams explaining that a bonding material 70 may flow out when there is no flow control structure. FIG. 7A to FIG. 7D show an example of formation of solder balls. The inner metal layer 12a functions as a metal layer to which a bonding material 70 is applied. The case in which there is no outer metal layer 12b disposed outward of the inner metal layer 12a when bonding the cover 20 to the base 10 will be considered. In this case, the bonding material 70 disposed on the inner metal layer 12a more readily runs over the inner metal layer 12a, flowing outward of the outer edge of the cover 20 and spreads in a plan view, as the area of contact with the first cover-side metal layer 21a increases. If the interval between the base 10 and the cover 20 is small, the bonding material 70 present in the narrow space readily spreads outward of the outer edge of the cover 20 by the capillary action. As shown in FIG. 7C, a portion of the bonding material 70 which flowed outward of the outer edge of the cover 20 forms a solder ball 71 on the second upper surface region 11b of the difficult-to-wet base 10. Accordingly, one or more solder balls 71 may be easily formed along the outer edge of the cover 20 as shown in FIG. 7D. The solder balls 71 that are formed on the second upper surface region 11b of the difficult-to-wet base 10 easily become loose. This can cause a short circuit when the light emitting device is incorporated into a module or the like.

Figure 8A:
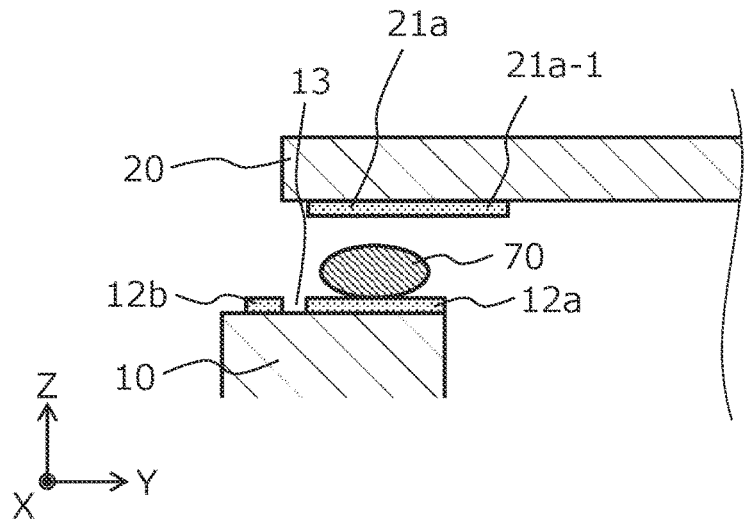
FIG. 8A is a schematic diagram explaining reduction in solder ball formation by a flow control structure.
Figure 8B:
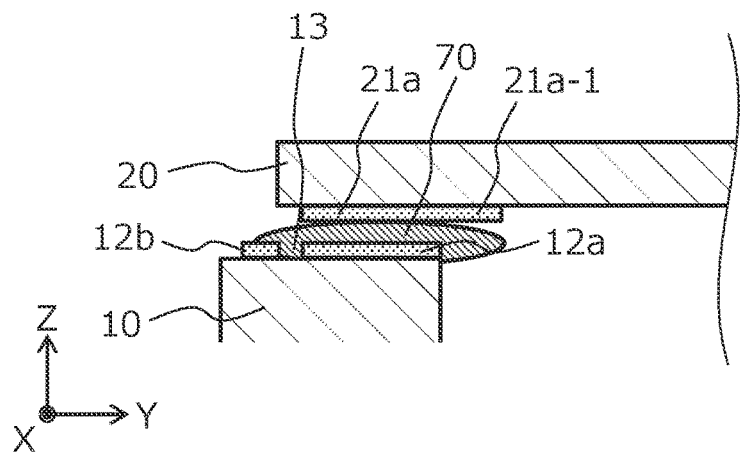
FIG. 8B is a schematic diagram explaining reduction in solder ball formation by a flow control structure.
Figure 8C:
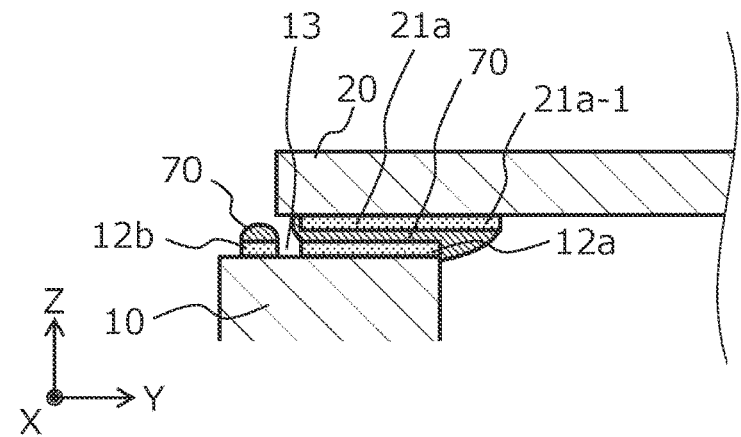
FIG. 8C is a schematic diagram explaining reduction in solder ball formation by a flow control structure.
Figure 8D:
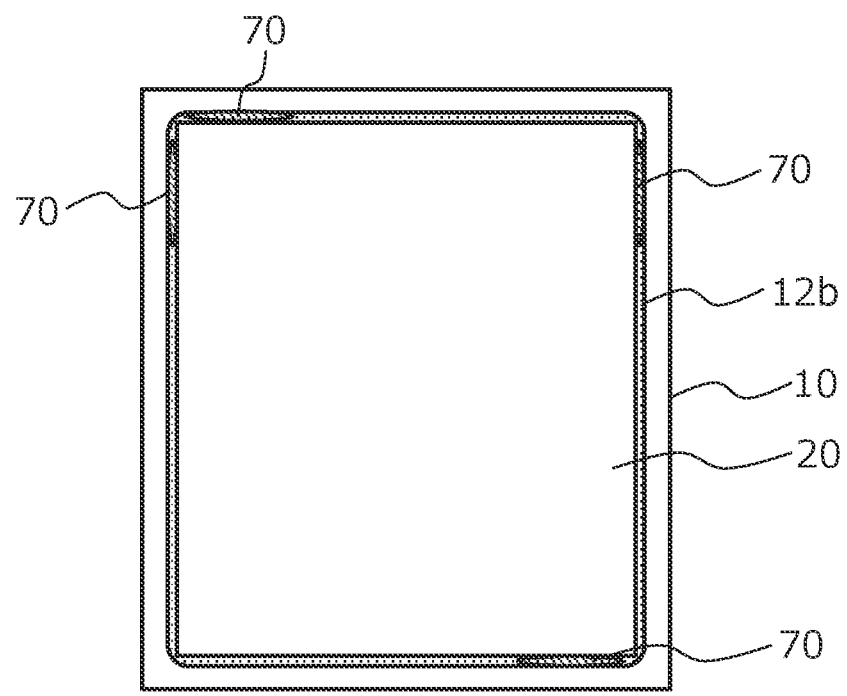
FIG. 8D is a schematic diagram explaining reduction in solder ball formation by a flow control structure.

FIG. 8A to FIG. 8D are schematic diagrams explaining that a flow control structure can control the outflow of the bonding material 70. FIG. 8A to FIG. 8D show, as an example, how the formation of solder balls can be controlled. According to the flow control structure of this embodiment, because no metal layer is disposed in the slit part 13, the second upper surface region 11b of the base 10 is exposed. Thus, the slit part 13 is less wettable by the bonding material 70 than the inner metal layer 12a or the outer metal layer 12b, i.e., the slit part is difficult to wet. Accordingly, the slit part 13 functions as a stopper to control the spreading of the bonding material 70. The slit part 13 allows the inner metal layer 12a to retain the bonding material 70 in the amount needed for sealing. The outer metal layer 12b functions as an absorbing layer for a case in which an excessive amount of the bonding material 70 is disposed. If an excess amount of the bonding material 70 is deposited, the bonding material 70 may overflow from the slit part 13 to spread outward from the outer edge of the cover 20. Even in such a case, the portion of the bonding material 70 that reaches the outer metal layer 12b spreads over the surface of, and is absorbed by, the outer metal layer 12b as shown in FIG. 8C or FIG. 8D. For example, even if a molten bonding material flows out when bonding the cover 20 to the base 10 by soldering or brazing, the molten metal is absorbed by the surface of the outer metal layer 12b. This can reduce the formation of solder balls.

Furthermore, the inner portion 21a-1 of the first cover-side metal layer 21a disposed on the lower surface region 20a of the cover 20 performs its function to allow the bonding material 70 to wet and spread on the surface of the inner portion 21a-1. This, as a result, can prevent a portion of the bonding material 70 from running over the first cover-side metal layer 21a to spatter on the first upper surface region 11a of the base 10, thereby ensuring the reliability of the semiconductor light emitting element 40 or any other electronic part arranged on the first upper surface region 11a.

As described above, the flow control structure can adequately control the outflow of the bonding member 70. Furthermore, even in the case of a small amount of bonding material 70, sealing deficiencies are unlikely to occur because the slit part 13 can keep the spreading of the bonding material 70 to a small area.

Variations of the flow control structure according to this embodiment will be explained with reference to FIG. 9 to FIG. 12. The flow control structure can further include a second cover-side metal layer or a ridge part disposed on the cover.

Figure 9:
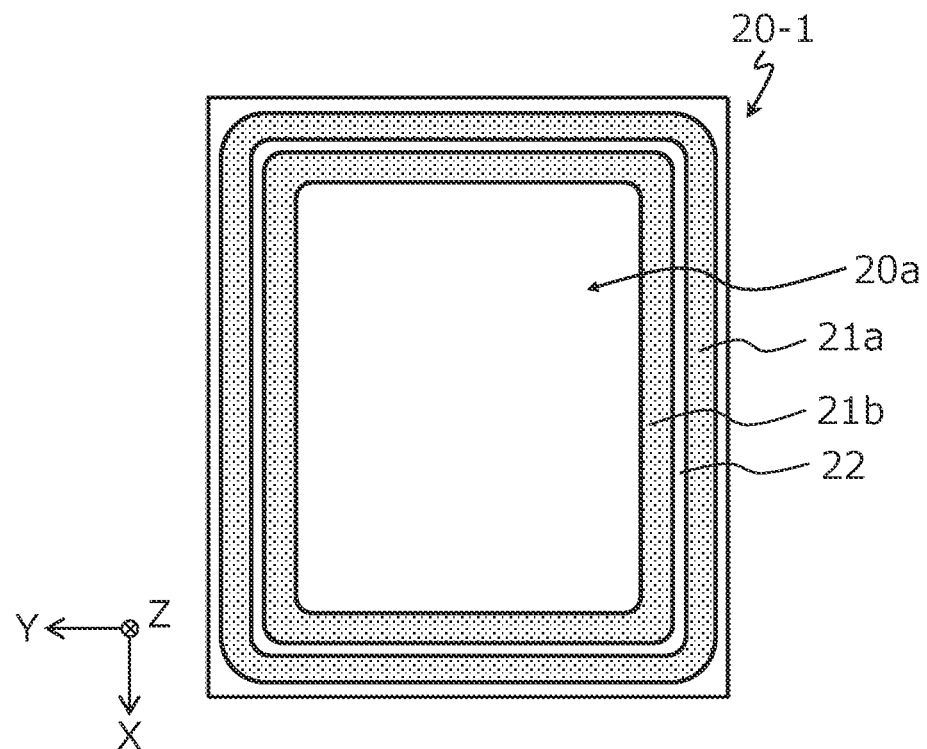
FIG. 9 is a bottom view of the cover which further has a second cover-side metal layer.
Figure 10:
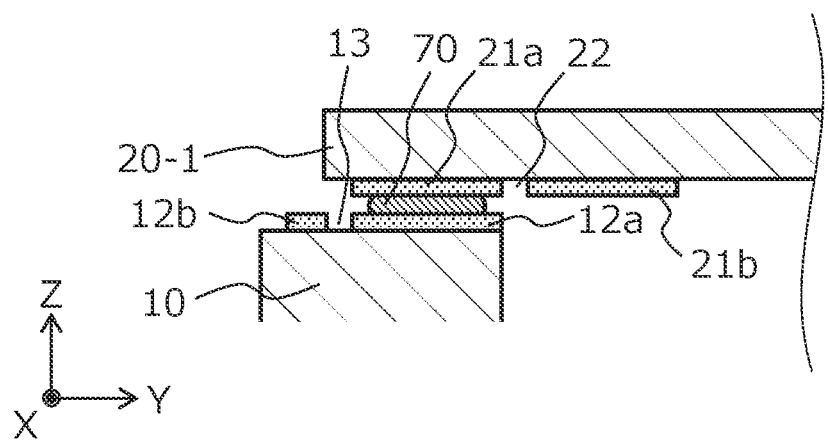
FIG. 10 is an enlarged view of a portion of the joint between the base and the cover of a variation of the flow control structure.

FIG. 9 shows the bottom surface of a cover 20-1 which further has a second cover-side metal layer 21b when viewed from the lower surface region 20a side. FIG. 10 is an enlarged view of a portion of the joint between the base 10 and the cover 20-1. The enlarged portion shown in FIG. 10 corresponds to the enlarged portion shown in FIG. 6.

The cover 20-1 of this variation can have a second cover-side metal layer 21b and a cover-side slit part 22 in a plan view. The second cover-side metal layer 21b is positioned inward of the inner edge of the first cover-side metal layer 21a in the lower surface region 20a, and extends along the inner edge of the first cover-side metal layer 21a. The cover-side slit part 22 is located between the first cover-side metal layer 21a and the second cover-side metal layer 21b. The second cover-side metal layer 21b, however, does not need to be continuously formed along the inner edge of the first cover-side metal layer 21a as shown in the drawing, and can be disposed intermittently. The width of the cover-side slit part 22 is, for example, 30 μm to 500 μm. The cover-side slit part 22, similar to the slit part 13 of the base 10, functions as a stopper to control the spreading of the bonding member 70. The second cover-side metal layer 21b, similarly to the outer metal layer 12b of the base 10, performs its function to allow the bonding member 70 to wet and spread.

Figure 11:
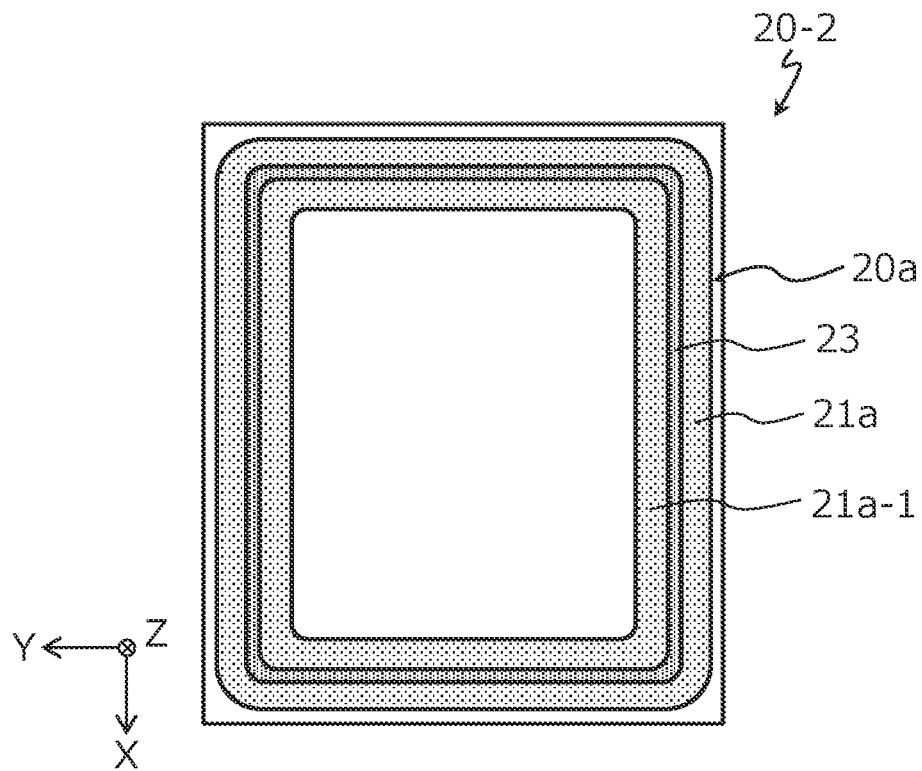
FIG. 11 is a bottom view of the cover which further has a ridge part.
Figure 12:
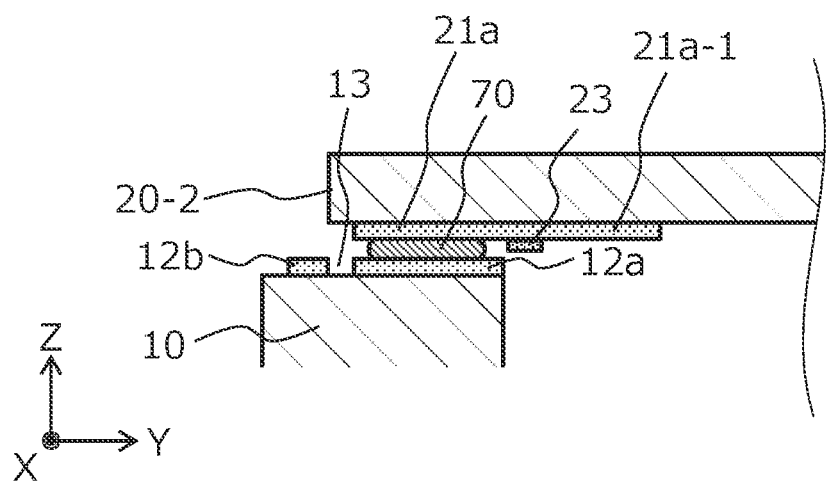
FIG. 12 is an enlarged view of a portion of the joint between the base and the cover of another variation of the flow control structure.

FIG. 11 is a bottom view of a cover 20-2 which further has a ridge part 23 when viewed from the lower surface region 20a side. FIG. 12 is an enlarged view of a portion of the joint between the base 10 and the cover 20-2. The enlarged portion shown in FIG. 12 corresponds to the enlarged portion shown in FIG. 6.

The first cover-side metal layer 21a of this variation includes an inner portion 21a-1 positioned inward of the inner edge of the inner metal layer 12a in a plan view. The cover 20-2 in the plan view has a ridge part 23 disposed on the inner portion 21a-1 of the first cover-side metal layer 21a and extending along the inner edge of the inner metal layer 12a. The ridge part 23 can be positioned, for example, in a range of 30 μm to 500 μm away from the inner edge of the inner metal layer 12a. The ridge part 23 does not need to be formed continuously along the inner edge of the inner metal layer 12a, and may be disposed intermittently. The ridge part 23 can be formed of, for example, platinum, titanium, chromium, or $SiO_2$. The ridge part 23 functions as a stopper to control the spreading of the bonding member 70.

These variations can reduce the effect of solder spattering on the support member 15a of the package while adequately reducing the formation of solder balls, thereby ensuring the reliability of the semiconductor light emitting element 40 or any other electronic component.

Submount 30

The submount 30 can have a rectangular cuboid shape. However, the shape of the submount 30 is not limited to a rectangular cuboid. The submount 30 can be formed, for example, from silicon nitride, aluminum nitride, or silicon carbide.

Semiconductor Light Emitting Element 40

An example of the semiconductor light emitting element 40 is a laser diode. For the semiconductor light emitting element 40, for example, a blue light emitting laser diode, green light emitting laser diode, red light emitting laser diode, or the like can be used. Furthermore, a laser diode that emits invisible light, such as infrared or ultraviolet light, may be employed.

In the present disclosure, blue light refers to the light having a peak emission wavelength falling within a range of 420 nm to 494 nm. Green light refers to the light having a peak emission wavelength falling within a range of 495 nm to 570 nm. Red light refers to the light having a peak emission wavelength falling within a range of 605 nm to 750 nm.

Examples of blue or green light emitting semiconductor light emitting elements include laser diodes that include a nitride semiconductor. For nitride semiconductors, for example, GaN, InGaN, and AlGaN can be used. Examples of red light emitting semiconductor light emitting elements include a semiconductor light emitting element that contain an InAlGaP-based, GaInP-based, GaAs-based, or AlGaAs-based semiconductor.

Optical Member 50

An optical member 50 has a prism shape, for example. A prism is a columnar structure having a polygonal bottom surface. Examples of the bottom surface shapes of such prisms include a triangle, quadrangle, and pentagon. The shape of the optical member 50 is not limited to a prism. The optical member 50 can be formed from, for example, a light-transmissive material, such as glass, plastic, quartz, or the like, a metal, or silicon. The optical member 50 illustrated in FIG. 3 is a triangular prism shaped member having a reflective surface 51 and a lower surface 52. The lower surface 52 is the bonding surface that is bonded to the planar support surface 15a of the base 10.

The optical member 50 has a reflective surface 51 which reflects the light from the semiconductor light emitting element 40 emitted in parallel with the planar support surface 15a towards the light transmitting portion of the cover 20. The reflective surface 51 is oblique to the lower surface 52. The reflective surface 51 is oblique to the lower surface 52 at an oblique angle of 25 to 65 degrees, for example. In the light emitting device 100 illustrated in the drawing, the reflective surface 51 is oblique to the lower surface 52 at a 45 degree oblique angle. The reflective surface 51 may be a partial reflective surface that allows a portion of the incident light to pass through while reflecting the remaining portion. The reflective surface 51 can be formed, for example, by disposing on a light-transmissive material a light reflection control film that reflects the incident light. The light reflection control film can be formed from a metal film, such as Ag or Al. Alternatively, the light reflection control film can be a dielectric multilayer film formed from $Ta_2O_5/SiO_2$, $TiO_2/SiO_2$, $Nb_2O_5/SiO_2$, or the like.

The light from the semiconductor light emitting element 40 emitted in parallel with the planar support surface 15a of the base 10 (in the X direction in the drawing) is reflected by the reflective surface 51 of the optical member 50 upwards (in the Z direction) in the drawing. The light emitting device 100 outputs from the package P through the light transmitting portion of the cover 20 the light reflected by the reflective surface 51.

Figure 13:
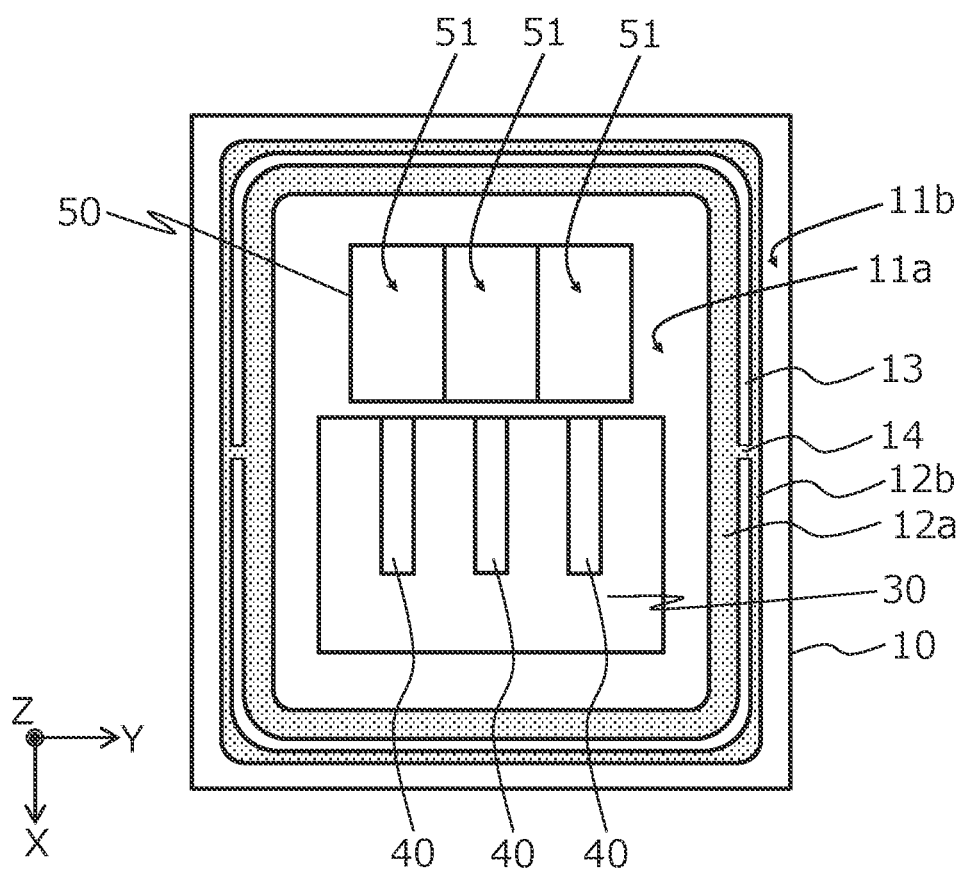
FIG. 13 is a plan view of the light emitting device according to the first embodiment, shown without a cover, after disposing a plurality of semiconductor light emitting elements.

The light emitting device 100 in this embodiment may include a plurality of semiconductor light emitting elements 40. FIG. 13 is a plan view of the light emitting device 100, shown without a cover, in which a plurality of semiconductor light emitting elements 40 are disposed. In FIG. 13, three semiconductor light emitting elements 40 are shown. The number of semiconductor light emitting elements 40 is not limited to this, and can be two, four or more. The three semiconductor light emitting elements 40 may emit light of different peak wavelengths from one another selected from, for example, blue, green, and red. In FIG. 13, the optical member 50 may have three reflective surfaces 51, at each of which light emitted from a respective one of the three semiconductor light emitting elements 40 is reflected. The three reflective surfaces 51 may be made up of three separate optical members or three reflective regions provided in a single optical member. Such a light emitting device can be utilized as a light source of a display device, for example.

Example of Method of Manufacturing Light Emitting Device 100

A method of manufacturing a light emitting device 100 according to an embodiment can include a step of preparing a base and a cover (A), a step of disposing a semiconductor light emitting element on the first upper surface region of the base (B), a step of applying a bonding material on the inner metal layer (C), and a step of bonding the cover and the base via the bonding material (D).

In step (A), a base 10 which has a first upper surface region 11a and a second upper surface region 11b surrounding the first upper surface region 11a in a plan view is prepared. Then, an inner metal layer 12a and an outer metal layer 12b that extends along the outer edge of the inner metal layer 12a are formed on the second upper surface region 11b of the base 10, for example, by electroplating or vapor deposition. In this operation, a portion of the second upper surface region 11b where no metal layer is to be provided is, for example, masked with a resist material, so that a slit part 13 is formed between the inner metal layer 12a and the outer metal layer 12b.

When bonding the cover 20 to the base 10, a first cover-side metal layer 21a is formed, for example, by electroplating or vapor deposition in the portion of the lower surface region 20a of the cover 20 that opposes the inner metal layer 12a.

In step (B), on the first upper surface region 11a of the base 10, a submount 30 having a semiconductor light emitting element 40 bonded thereto and an optical member 50 are disposed.

In step (C), a bonding material 70 (e.g., solder) is applied to the inner metal layer 12a of the base 10. The bonding material 70 may be applied on the first cover-side metal layer 21a.

In step (D), the cover 20 and the base 10 are bonded via the bonding material 70, for example, by soldering or brazing. A light emitting device 100 is produced by following the steps described above.

Second Embodiment

A light emitting device according to a second embodiment of the present disclosure will be explained with reference to FIG. 14 to FIG. 19. The light emitting device according to the second embodiment differs from the light emitting device according to the first embodiment in that light emitted from a semiconductor light emitting element laterally exits the package. The explanation below will be focused on the differences from the first embodiment.

Figure 14:
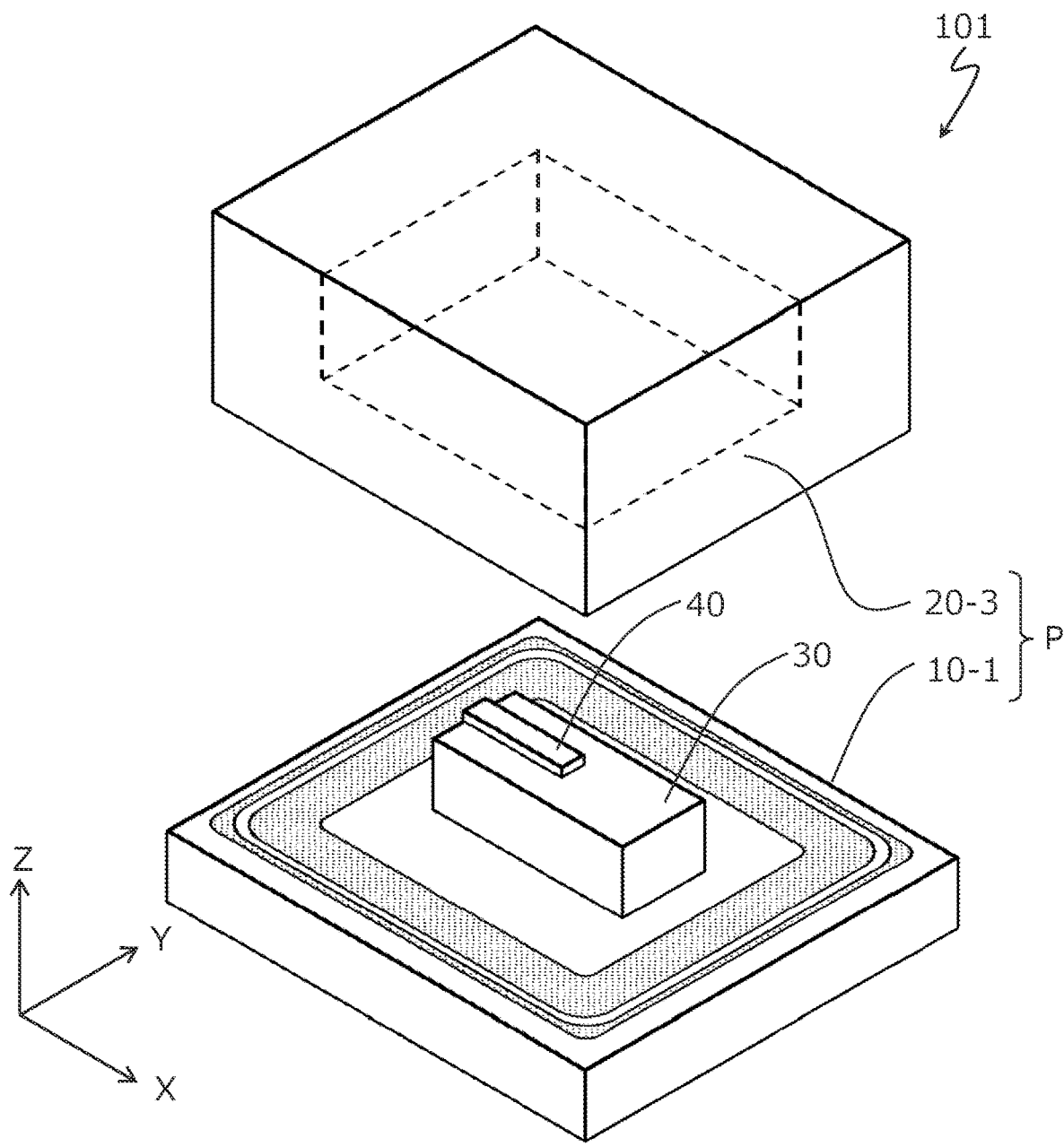
FIG. 14 is an exploded view of a light emitting device according to a second embodiment of the present disclosure.
Figure 15:
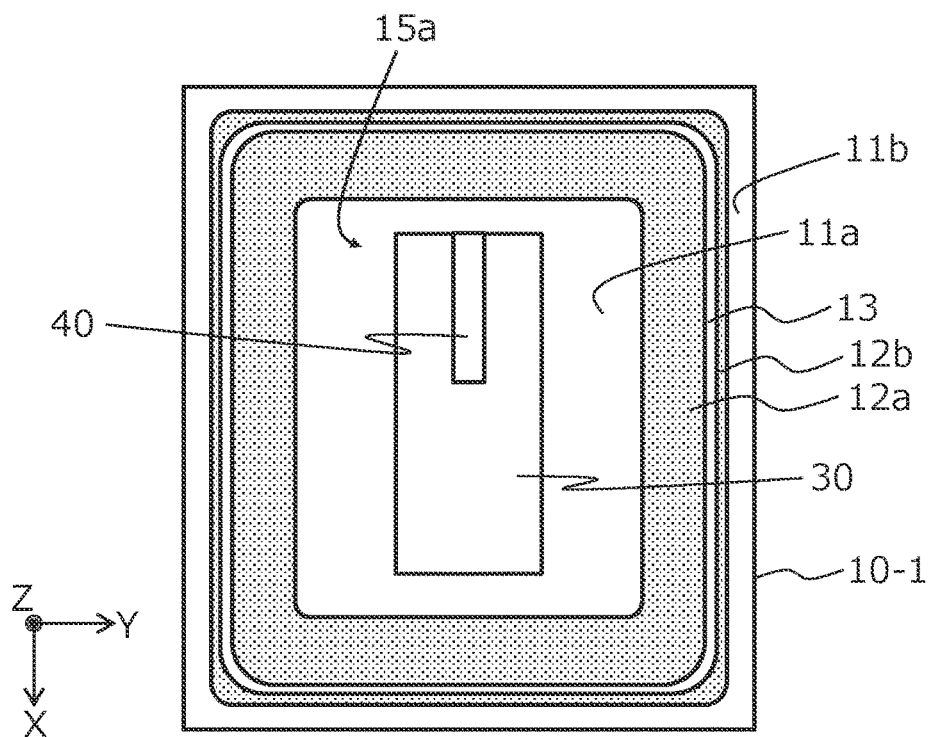
FIG. 15 is a plan view of the light emitting device according to the second embodiment of the present disclosure shown without a cover.
Figure 16:
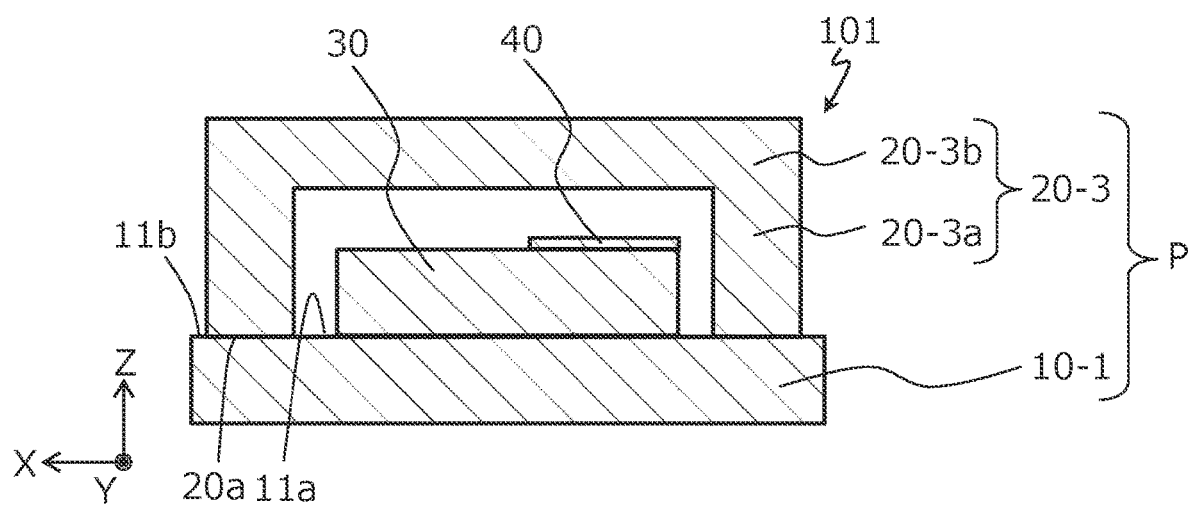
FIG. 16 is a cross-sectional view in the XZ plane of the light emitting device according to the second embodiment of the present disclosure.
Figure 17:
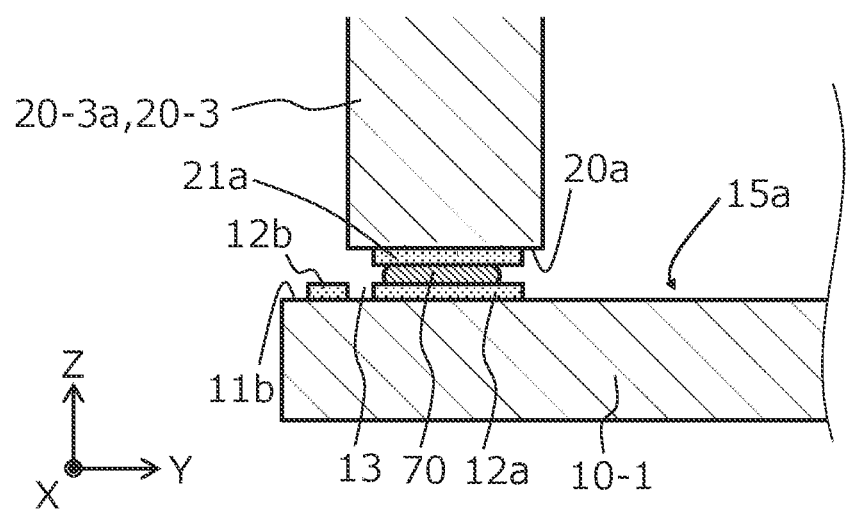
FIG. 17 is an enlarged view of a portion of the joint between the base and the cover.

FIG. 14 is an exploded view of a light emitting device 101 according to the second embodiment. FIG. 15 is a plan view of the light emitting device 101 shown without a cover 20-3. FIG. 16 is a cross-sectional view in the XZ plane of the light emitting device 101. FIG. 17 is an enlarged view of a portion of the joint between the base 10-1 and the cover 20-3.

The light emitting device 101 according to this embodiment includes a base 10-1, a cover 20-3, a submount 30, and a semiconductor light emitting element 40 supported by the submount 30. The base 10-1 has a planar support surface 15a which includes a first upper surface region 11a, and a second upper surface region 11b positioned outward of the first upper surface region 11a. The cover 20-3 has a lateral wall part 20-3a supported by the planar support surface 15a and an upper surface part 20-3b located on the lateral wall part 20-3a. The cover 20-3 shown in the drawings is a member in which the lateral wall part 20-3a and the upper surface part 20-3b are integrally formed, without being limited thereto. The lateral wall part 20-3a and the upper surface part 20-3b may be separate members where the upper surface part 20-3b is bonded to the upper surface of the lateral wall part 20-3a. The lateral wall part 20-3a has a light transmitting portion through which light emitted from the semiconductor light emitting element 40 passes. At least the light transmitting portion of the cover 20-3 can be formed from a light-transmissive material, such as sapphire, glass, plastic, quartz, or the like. The remaining portion does not have to be formed from a light-transmissive material.

The light emitting device 101 allows the light from the semiconductor light emitting element 40 emitted in parallel with the planar support surface 15a to laterally exit the package P through the light transmitting portion of the lateral wall part 20-3a.

The base 10-1 has an inner metal layer 12a, an outer metal layer 12b, and a slit part 13 on the second upper surface region 11b. The lateral wall part 20-3a has a lower surface region 20a in the bonding surface, which is bonded to the planar support surface 15a of the base 10-1. The flow control structure in this embodiment has practically the same structure and function as those of the flow control structure in the first embodiment for which the detailed description is omitted. According to the light emitting device 101, similarly to the first embodiment, formation of solder balls can be adequately controlled.

Figure 18:
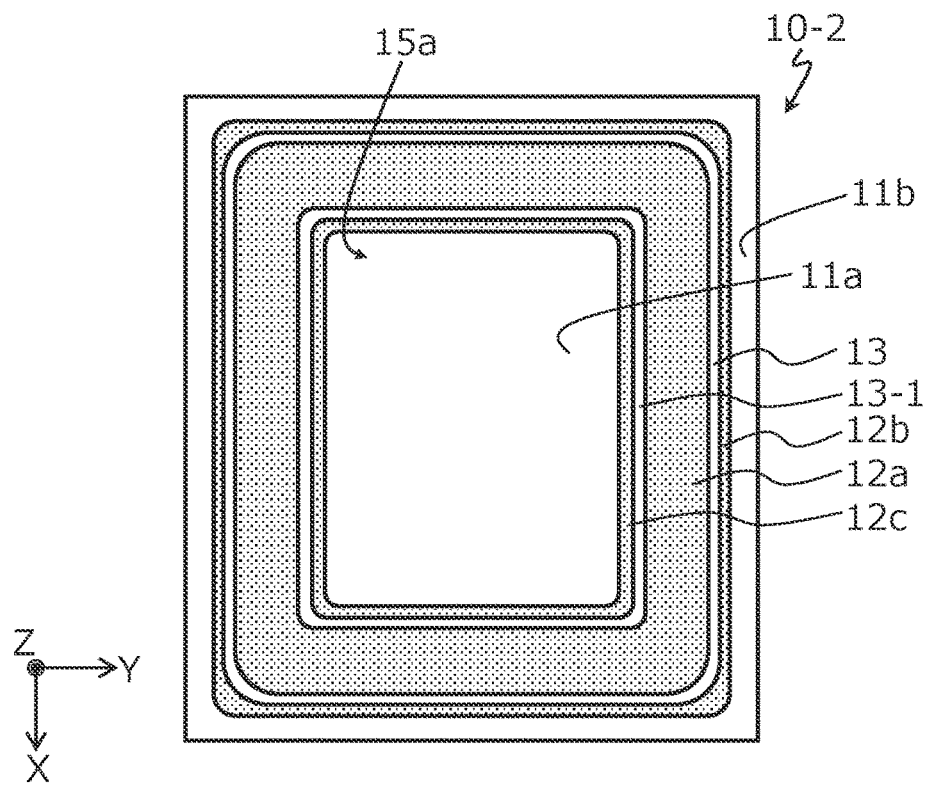
FIG. 18 is a plan view of the base which further has additional inner metal layer positioned inward of the inner edge of the inner metal layer.

FIG. 18 is a plan view of the base 10-2 which further has an additional inner metal layer 12c positioned inward of the inner edge of the inner metal layer 12a.

The base 10-2 can have the additional inner metal layer 12c positioned inward of the inner edge of the inner metal layer 12a on the planar support surface 15a and extending along the inner edge of the inner metal layer 12a in a plan view. There may be an additional slit part 13-1 between the inner metal layer 12a and the inner metal layer 12c. The slit part 13-1, similarly to the slit part 13c, functions as a stopper to control the spreading of the bonding material 70. The inner metal layer 12c, similarly to the outer metal layer 12b, functions as a layer that absorbs excess bonding material 70. According to this flow control structure, the spreading of the bonding material 70 towards the first upper surface region 11a of the planar support surface 15a can be adequately reduced.

Figure 19:
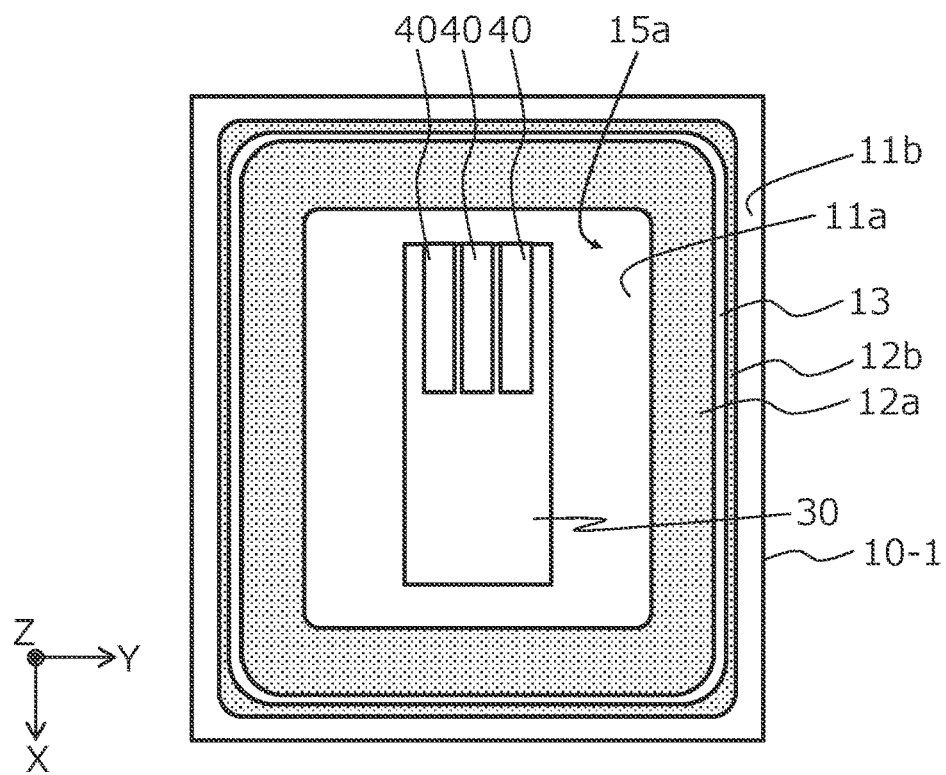
FIG. 19 is a plan view of the light emitting device according to the second embodiment of the present disclosure, shown without a cover, after disposing a plurality of semiconductor light emitting elements.

FIG. 19 is a plan view of a light emitting device 101, shown without a cover, in which a plurality of semiconductor light emitting elements 40 are arranged. The light emitting device 101 in this embodiment, similar to the first embodiment, can include a plurality of semiconductor light emitting elements 40. The three semiconductor light emitting elements 40 shown in the drawing can emit light of different peak wavelengths from one another selected from blue, green, and red, for example. Such a light emitting device can be utilized as a light source of a display device, for example.

The flow control structure according to an embodiment of the present disclosure is applicable to a package for sealing not only a semiconductor light emitting element, but also any other electronic part, such as a light receiving element.

A light emitting device according to the present disclosure can be utilized in, for example, a head-mounted display, projector, display, or lighting fixture.

What is claimed is:
1. A light emitting device comprising:
a semiconductor light emitting element; and
a package that seals the semiconductor light emitting element, the package comprising:
a base comprising:
a first upper surface region directly or indirectly supporting the semiconductor light emitting element, and
a second upper surface region surrounding the first upper surface region in a plan view viewed in a direction normal to the first upper surface region, a cover bonded to the base,
an inner metal layer disposed on the second upper surface region of the base,
an outer metal layer extending along the outer edge of the inner metal layer, and
a slit part on the second upper surface region between the inner metal layer and the outer metal layer; wherein:
in the plan view, the inner edge of the inner metal layer is positioned inward of the outer edge of the cover;
in the plan view, at least a portion of the outer edge of the outer metal layer is positioned outward of the outer edge of the cover;
the cover comprises:
a lower surface region facing the first upper surface region and the second upper surface region of the base,
a first cover-side metal layer in a portion of the lower surface region that faces the inner metal layer,
a second cover-side metal layer that, in the plan view, is positioned inward of the inner edge of the first cover-side metal layer in the lower surface region and extends along the inner edge of the first cover-side metal layer, and
a second cover-side slit part between the first cover-side metal layer and the second cover-side metal layer in the plan view; and
the cover is bonded to the base via a bonding material disposed on the inner metal layer.

2. The light emitting device according to claim 1, wherein the outer edge of the inner metal layer is positioned inward of the outer edge of the cover, and the outer edge of the outer metal layer is positioned outward of the outer edge of the cover.

3. The light emitting device according to claim 2, wherein a width of the slit part is in a range of 30 µm to 500 µm.

4. The light emitting device according to claim 2, wherein the inner metal layer and the outer metal layer are electrically connected by one or more metal branched parts.

5. The light emitting device according to claim 1, wherein the bonding material is a solder.

6. The light emitting device according to claim 1, wherein:
in the package, the semiconductor light emitting element is hermetically sealed by bonding the first cover-side metal layer and the inner metal layer via a bonding layer made of the bonding material.

7. The light emitting device according to claim 6, wherein, in the plan view, the first cover-side metal layer comprises an inner portion positioned inward of the inner edge of the inner metal layer.

8. The light emitting device according to claim 7, wherein, in the plan view, the cover comprises a ridge part disposed on the inner portion of the first cover-side metal layer along the inner edge of the inner metal layer.

9. The light emitting device according to claim 1, wherein the package has a height difference between the first upper surface region and the second upper surface region.

10. The light emitting device according to claim 1, wherein:
the base comprises a bottom part having a planar support surface, and a lateral wall part supported on a plane including the planar support surface,
the first upper surface region is located in the planar support surface, and the second upper surface region is located in an upper surface of the lateral wall part positioned higher than the planar support surface,
the inner metal layer and the outer metal layer are disposed on the upper surface of the lateral wall part, and
the cover has a light transmitting portion that transmits light emitted from the semiconductor light emitting element.

11. The light emitting device according to claim 1, wherein:
the base has a planar support surface that includes the first upper surface region and the second upper surface region,
the cover has a lateral wall part supported by the planar support surface and an upper surface part located on the lateral wall part,
the lateral wall part comprises a light transmitting portion that transmits light emitted from the semiconductor light emitting element, and
the light emitted from the semiconductor light emitting element in a direction parallel to the planar support surface is emitted from the light transmitting portion to a region outside of the package.

12. The light emitting device according to claim 11, wherein:
in the plan view, the base further comprises:
an additional inner metal layer positioned inward of the inner edge of the inner metal layer on the planar support surface and extending along the inner edge of the inner metal layer, and
an additional slit part between the inner metal layer and the additional inner metal layer.

13. A light emitting device comprising:
a semiconductor light emitting element; and
a package that seals the semiconductor light emitting element, the package comprising:
a base comprising:
a first upper surface region directly or indirectly supporting the semiconductor light emitting element, and
a second upper surface region surrounding the first upper surface region in a plan view viewed in a direction normal to the first upper surface region,
a cover bonded to the base,
an inner metal layer disposed on the second upper surface region of the base,
an outer metal layer extending along the outer edge of the inner metal layer, and
a slit part on the second upper surface region between the inner metal layer and the outer metal layer; wherein:
in the plan view, the inner edge of the inner metal layer is positioned inward of the outer edge of the cover;
in the plan view, at least a portion of the outer edge of the outer metal layer is positioned outward of the outer edge of the cover;
the cover comprises:
a lower surface region facing the first upper surface region and the second upper surface region of the base, and
a first cover-side metal layer in a portion of the lower surface region that faces the inner metal layer;
in the plan view, the first cover-side metal layer comprises an inner portion positioned inward of the inner edge of the inner metal layer; and
the cover is bonded to the base via a bonding material disposed on the inner metal layer.

14. The light emitting device according to claim 13, wherein the outer edge of the inner metal layer is positioned inward of the outer edge of the cover, and the outer edge of the outer metal layer is positioned outward of the outer edge of the cover.

15. The light emitting device according to claim 14, wherein a width of the slit part is in a range of 30 µm to 500 µm.

16. The light emitting device according to claim 14, wherein the inner metal layer and the outer metal layer are electrically connected by one or more metal branched parts.

17. The light emitting device according to claim 13, wherein the bonding material is a solder.

18. The light emitting device according to claim 13, wherein in the package, the semiconductor light emitting element is hermetically sealed by bonding the first cover-side metal layer and the inner metal layer via a bonding layer made of the bonding material.

19. The light emitting device according to claim 13, wherein the package has a height difference between the first upper surface region and the second upper surface region.

20. The light emitting device according to claim 13, wherein:
   the base comprises a bottom part having a planar support surface, and a lateral wall part supported on a plane including the planar support surface,
   the first upper surface region is located in the planar support surface, and the second upper surface region is located in an upper surface of the lateral wall part positioned higher than the planar support surface,
   the inner metal layer and the outer metal layer are disposed on the upper surface of the lateral wall part, and
   the cover has a light transmitting portion that transmits light emitted from the semiconductor light emitting element.

21. The light emitting device according to claim 13, wherein:
   the base has a planar support surface that includes the first upper surface region and the second upper surface region,
   the cover has a lateral wall part supported by the planar support surface and an upper surface part located on the lateral wall part,
   the lateral wall part comprises a light transmitting portion that transmits light emitted from the semiconductor light emitting element, and
   the light emitted from the semiconductor light emitting element in a direction parallel to the planar support surface is emitted from the light transmitting portion to a region outside of the package.

22. The light emitting device according to claim 21, wherein:
   in the plan view, the base further comprises:
      an additional inner metal layer positioned inward of the inner edge of the inner metal layer on the planar support surface and extending along the inner edge of the inner metal layer, and
      an additional slit part between the inner metal layer and the additional inner metal layer.

* * * * *